(12) United States Patent
Zhang et al.

(10) Patent No.: US 11,567,701 B2
(45) Date of Patent: *Jan. 31, 2023

(54) ELECTRONIC APPARATUS AND METHOD OF MANAGING READ LEVELS OF FLASH MEMORY

(71) Applicant: YANGTZE MEMORY TECHNOLOGIES CO., LTD., Wuhan (CN)

(72) Inventors: Huang Peng Zhang, Wuhan (CN); Xiang Fu, Wuhan (CN); Qi Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/235,935

(22) Filed: Apr. 21, 2021

(65) Prior Publication Data

US 2021/0240397 A1 Aug. 5, 2021

Related U.S. Application Data

(63) Continuation of application No. 16/438,386, filed on Jun. 11, 2019, now Pat. No. 11,016,705, which is a continuation of application No. PCT/CN2019/085141, filed on Apr. 30, 2019.

(51) Int. Cl.
| | |
|---|---|
| *G11C 16/26* | (2006.01) |
| *G06F 3/06* | (2006.01) |
| *G06F 13/16* | (2006.01) |
| *G06F 13/28* | (2006.01) |

(52) U.S. Cl.
CPC .......... *G06F 3/0659* (2013.01); *G06F 3/0604* (2013.01); *G06F 3/0679* (2013.01); *G06F 13/1668* (2013.01); *G06F 13/28* (2013.01)

(58) Field of Classification Search
CPC .................................................. G06F 3/0659
See application file for complete search history.

(56) References Cited

U.S. PATENT DOCUMENTS

| | | | |
|---|---|---|---|
| 5,956,743 A | 9/1999 | Bruce | |
| 6,085,281 A | 7/2000 | Kopp et al. | |
| 6,279,153 B1 | 8/2001 | Bi | |
| (Continued) | | | |

FOREIGN PATENT DOCUMENTS

| | | |
|---|---|---|
| CN | 1973334 A | 5/2007 |
| CN | 101617372 A | 12/2009 |
| (Continued) | | |

OTHER PUBLICATIONS

Qu Yangxia et al., The Application of Flash Memory in Stored Testing and Measurement Systems, PLD CPLD FPGA, Microcomputer Information, vol. 24, No. 3-2, China, 2008, pp. 222-223.

*Primary Examiner* — Min Huang
(74) *Attorney, Agent, or Firm* — Bayes PLLC

(57) ABSTRACT

A controller includes memory and a microcontroller coupled to the memory. The memory is configured to store a list of entries of data in Flash memory coupled to the controller. The microcontroller is configured to periodically update the list of entries based on data programmed into the Flash memory, and check the list of entries upon reading data from the Flash memory.

20 Claims, 7 Drawing Sheets

(56) References Cited

U.S. PATENT DOCUMENTS

| | | |
|---|---|---|
| 8,045,377 B2 | 10/2011 | Kim |
| 8,051,257 B2 | 11/2011 | Gorobets |
| 8,874,278 B2 | 10/2014 | Kitakawa |
| 11,016,705 B2 * | 5/2021 | Zhang ................... G06F 3/0604 |
| 2002/0107594 A1 | 8/2002 | Taylor et al. |
| 2005/0195653 A1 | 9/2005 | Conley |
| 2007/0150881 A1 | 6/2007 | Khawand et al. |
| 2011/0131374 A1 | 6/2011 | Noeldner |
| 2012/0151118 A1 | 6/2012 | Flynn |
| 2016/0364835 A1 | 12/2016 | Srebnik et al. |
| 2017/0139839 A1 | 5/2017 | Ke |
| 2017/0185350 A1 | 6/2017 | Waidhofer |
| 2017/0206979 A1 | 7/2017 | Cohen |
| 2017/0271031 A1 * | 9/2017 | Sharon ................ G06F 11/3058 |
| 2017/0357311 A1 | 12/2017 | Hovis |
| 2019/0004938 A1 | 1/2019 | Siciliani |
| 2019/0074053 A1 | 3/2019 | Bang |
| 2019/0267100 A1 * | 8/2019 | Pan ........................ G11C 16/26 |
| 2019/0340134 A1 | 11/2019 | Haswell |

FOREIGN PATENT DOCUMENTS

| | | |
|---|---|---|
| CN | 101652757 A | 2/2010 |
| CN | 101884033 A | 11/2010 |
| CN | 102043737 A | 5/2011 |
| CN | 103221927 A | 7/2013 |
| CN | 107111576 A | 8/2017 |
| CN | 107293322 A | 10/2017 |
| CN | 107391392 A | 11/2017 |
| CN | 107430565 A | 12/2017 |
| CN | 107506309 A | 12/2017 |
| CN | 108595124 A | 9/2018 |
| CN | 109101437 A | 12/2018 |
| CN | 109213688 A | 1/2019 |
| CN | 109313475 A | 2/2019 |
| CN | 109313608 A | 2/2019 |
| CN | 109473138 A | 3/2019 |
| KR | 100546449 | 1/2006 |
| TW | 201329987 A1 | 7/2013 |
| TW | 201727493 A | 8/2017 |
| WO | 2012/001917 A1 | 1/2012 |

\* cited by examiner

ELECTRONIC APPARATUS AND METHOD OF MANAGING READ LEVELS OF FLASH MEMORY

CROSS REFERENCE TO RELATED APPLICATIONS

This application is a continuation of U.S. application Ser. No. 16/438,386, filed Jun. 11, 2019, which is a continuation of International Application No. PCT/CN2019/085141, filed Apr. 30, 2019, both of which are incorporated herein by reference in their entireties.

BACKGROUND

The present disclosure relates to semiconductor memory, and specifically, to an electronic apparatus and a method of managing read levels of flash memory.

Flash memories are widely adopted for non-volatile data storage in mobile devices and consumer electronics. Flash memory stores data in an array of memory cells by programming the memory cells to different threshold voltage levels. In a single level cell (SLC) flash memory, a memory cell has two possible nominal threshold voltage levels, and in a 2-bit multi-level cell (MLC) flash memory, a memory cell has four possible nominal threshold voltage levels. Flash memory may employ several read levels corresponding to the different threshold voltage levels to read data from the memory cells.

Flash memory may be implemented by floating gate technology or charge-trapping technology. Floating gate flash memory may store electrical charges in an isolated polysilicon conductive layer, and charge-trapping flash memory may hold electrical charges captive in a non-conductive silicon nitride insulation layer. Over the last few years, charge-trapping flash memory has gained popularity over floating gate flash memory owing to reduced manufacturing costs and enhanced write endurance. However, charge-trapping flash memory suffers from a fast initial charge loss problem, in which shallow-trapped charges escape from flash memory cells within a few seconds after programming, leading to charge leakage over time. Consequently, data in flash memory cells may not be accurately read using a default read level, resulting in progressive retention loss and gradual degradation of read performance.

Therefore, there is a need for a flash memory device with reliable read performance and a simple circuit structure.

SUMMARY

In one embodiment of the present disclosure, an electronic apparatus including flash memory and a flash controller is provided. The flash controller is coupled to the flash memory and used to manage data access to the flash memory. The flash controller includes a timer, memory and a microcontroller coupled to the timer and the memory. The timer is used to generate clock interrupts. The memory is used to retain, for a predetermined period of time, a list of entries of data programmed into the flash memory. Upon each clock interrupt, the microcontroller is used to write an entry of data being programmed into the flash memory to update the list of entries.

In another embodiment of the present disclosure, a method of managing read levels of flash memory is disclosed. The method is adopted by an electronic apparatus including the flash memory and a flash controller coupled thereto. The flash controller includes a timer, memory and a microcontroller. The method includes the timer generating clock interrupts, the memory retaining for a predetermined period of time a list of entries of data programmed into the flash memory, and upon each clock interrupt, the microcontroller writing an entry of data being programmed into the flash memory to update the list of entries.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

In the present disclosure, different read levels are used to read data from memory cells at different time periods after the memory cells are programmed, thereby resolving the fast initial charge loss problem and providing reliable read operations.

Figure 1:
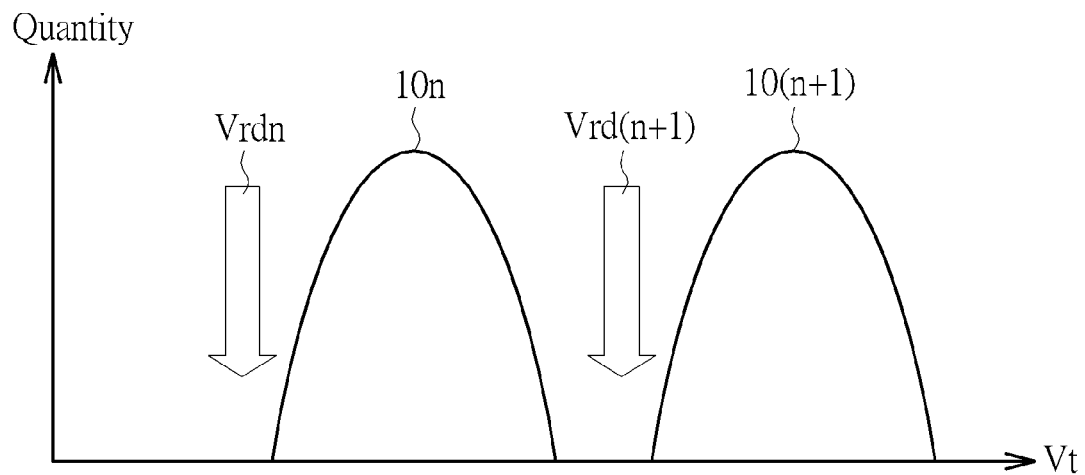
FIG. 1 shows threshold voltage distributions of a group of memory cells in an initial retention period.
Figure 2:
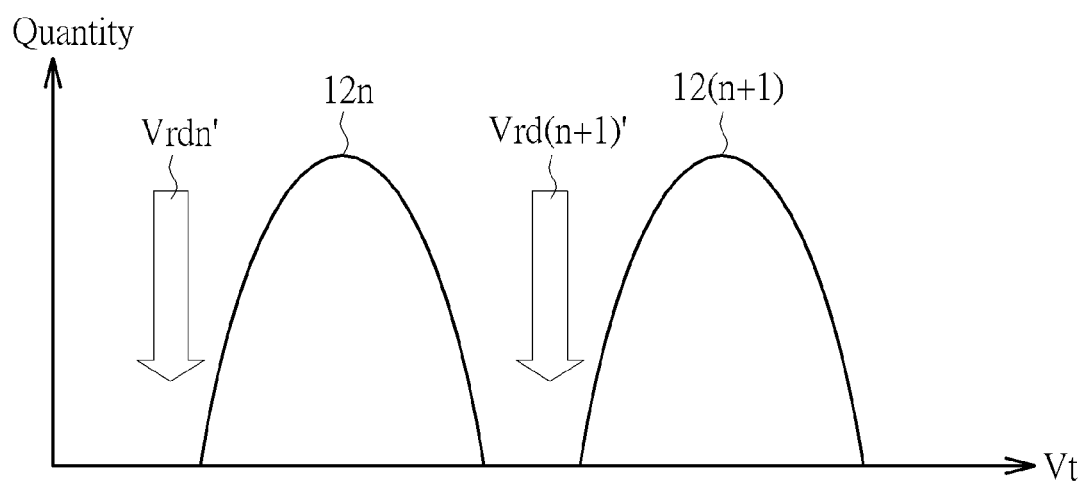
FIG. 2 shows threshold voltage distributions of the group of memory cells after the initial retention period.

FIGS. 1 and 2 depict the principle of managing read levels for a group of memory cells in a flash memory device according to an embodiment of the present disclosure. In particular, FIG. 1 shows threshold voltage distributions 10n and 10(n+1) and recently programmed read levels Vrdn and Vrd(n+1) for use in an initial retention period after programming, with the threshold voltage distributions 10n and 10(n+1) respectively representing distributions of the threshold voltages Vt of the group of memory cells in states n and (n+1), and the recently programmed read levels Vrdn and Vrd(n+1) respectively representing read levels used to read the states n and (n+1) of the group of memory cells. Likewise, FIG. 2 shows threshold voltage distributions 12n and 12(n+1) and default read levels Vrdn' and Vrd(n+1)' for use after the initial retention period, with the threshold voltage distributions 12n and 12(n+1) respectively representing distributions of the threshold voltages Vt of the group of memory cells in states n and (n+1), and the default read levels Vrdn' and Vrd(n+1)' respectively representing read levels used to read the states n and (n+1) of the group of memory cells.

Due to differences in characteristics of the memory cells such as variations in impurity concentrations or defects in the silicon structures, the group of memory cells exhibit the threshold voltage distributions 10*n*, 10(*n*+1), 12*n*, 12(*n*+1). The recently programmed read levels Vrdn and Vrd(n+1) are set to differentiate between the threshold voltage distributions 10*n* and 10(*n*+1), and similarly, the default read levels Vrdn' and Vrd(n+1)' are set to differentiate between the threshold voltage distributions 12*n* and 12(*n*+1). Data retrieval is accomplished by applying the read level Vrdn, Vrd(n+1), Vrdn' or Vrd(n+1)' to the group of memory cells. For example, when the recently programmed read level Vrd(n+1) is applied to the group of memory cells, memory cells in the state n will generate source currents since the recently programmed read level Vrd(n+1) exceeds the threshold voltages Vt in the threshold voltage distribution 10*n*, and memory cells in the state (n+1) will not generate source currents since the recently programmed read level Vrd(n+1) is less than the threshold voltages Vt in the threshold voltage distribution 10(*n*+1). As a result, by sensing the source currents, data held in the memory cells may be identified as being in the state n or state (n+1).

FIGS. 1 and 2 illustrate shifts of threshold voltage distributions over time. The threshold voltage distributions 10*n* and 10(*n*+1) are shifted to the left to produce the threshold voltage distributions 12*n* and 12(*n*+1) after the initial retention period elapses. Correspondingly, the read levels are adapted to compensate for the shifts of threshold voltage distributions. Specifically, the default read levels Vrdn' and Vrd(n+1)' are respectively set to be lower than the recently programmed read levels Vrdn and Vrd(n+1). Therefore, during the initial retention period, the higher recently programmed read levels Vrdn and Vrd(n+1) may be adopted to read data, and after the initial retention period passes, the lower default read levels Vrdn' and Vrd(n+1)' may be adopted to read data, thereby ensuring full time data retention for the memory cells.

Figure 3:
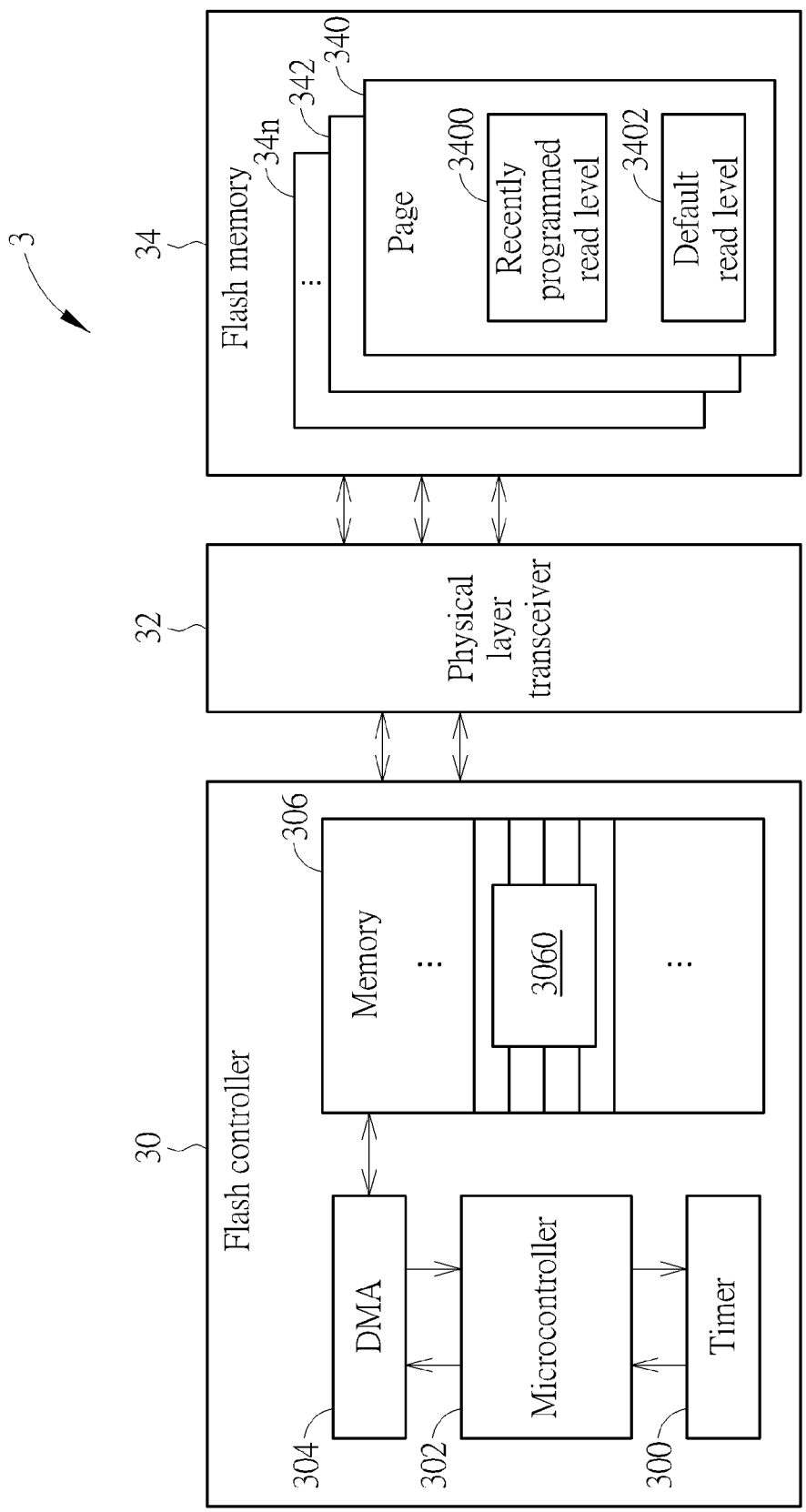
FIG. 3 is a block diagram of an electronic apparatus according to an embodiment of the present disclosure.

The read level adaptation over time as outlined in FIGS. 1 and 2 can be implemented by an electronic apparatus 3 in FIG. 3. The electronic apparatus 3 comprises a flash controller 30, a physical layer transceiver 32 and flash memory 34. The flash controller 30 is coupled to the flash memory 34 via the physical layer transceiver 32. The flash memory 34 comprises a plurality of pages 340 through 34*n*, and each of the pages 340 through 34*n* contains a plurality of memory cells arranged in an array for data storage. The memory cells may be single level cells (SLC) or multi-level cells (MLC). The flash controller 30 may control data access to the flash memory 34 and manage read levels for reading data from the flash memory 34. The physical layer transceiver 32 may interface data transfer between the flash controller 30 and the flash memory 34. The flash controller 30 comprises a timer 300, a microcontroller 302, a direct memory access (DMA) 304 and memory 306. The timer 300 is sequentially coupled to the microcontroller 302, the DMA 304, and then to the memory 306.

The timer 300 may generate clock interrupts and transmit the same to the microcontroller 302 to execute tasks that need to be processed periodically. For example, the timer 300 may generate a clock interrupt every second. The memory 306 may retain, for a predetermined period of time, a list of entries 3060 of data programmed into the flash memory 34, the list of entries 3060 being referred to as a recent programmed page (RPP) pool in some embodiments. Upon each clock interrupt, the microcontroller 302 may write an entry of data being programmed into the flash memory 34 to update the list of entries 3060. The DMA 304 may pass entries of data between the microcontroller 302 and the memory 306.

The microcontroller 302 may check the list of entries 3060 to determine whether data to be read is in the initial retention period, and set corresponding read levels accordingly. In some embodiments, the microcontroller 302 may employ a SET feature to set the read level at the flash memory 34 on the fly and instruct the flash memory 34 to use the set read level to read data. In other embodiments, a recently programmed read level 3400 and a default read level 3402 may be preset and stored in a predetermined page such as the page 340 in the flash memory 34 and the microcontroller 302 may instruct the memory 34 to use one of the recently programmed read level 3400 and the default read level 3402 to read data. In general, the preset read level method is more efficient in time than the set on the fly method, and will be addressed in more details in the following section. Specifically, prior to reading data from the flash memory 34, the microcontroller 302 may read the list of entries 3060 from the memory 306. When the data matches an entry in the list of entries 3060, the microcontroller 302 may transmit to the flash memory 34 a recently programmed read command indicating that the data being read is recently programmed data and instruct the flash memory 34 to perform a recently programmed read operation, and when the data matches no entry in the list of entries 3060, the microcontroller 302 may instruct the flash memory 34 to perform a normal read operation. The recently programmed data is defined as data in the initial retention period after programming. The recently programmed read operation is a read operation employing the recently programmed read level 3400, and the normal read operation is a read operation employing the default read level 3402. The recently programmed read level 3400 may exceed the default read level 3402.

The flash memory 34 may be NAND flash memory or NOR flash memory, and the flash controller 30 may be a NAND flash controller or a NOR flash memory controller. Further, although only two read levels are used in the electronic apparatus 3, it should be apparent to those who skilled in the art that more than two read levels may be adopted by the electronic apparatus 3 to account for threshold voltage shifts over time.

Figure 4:
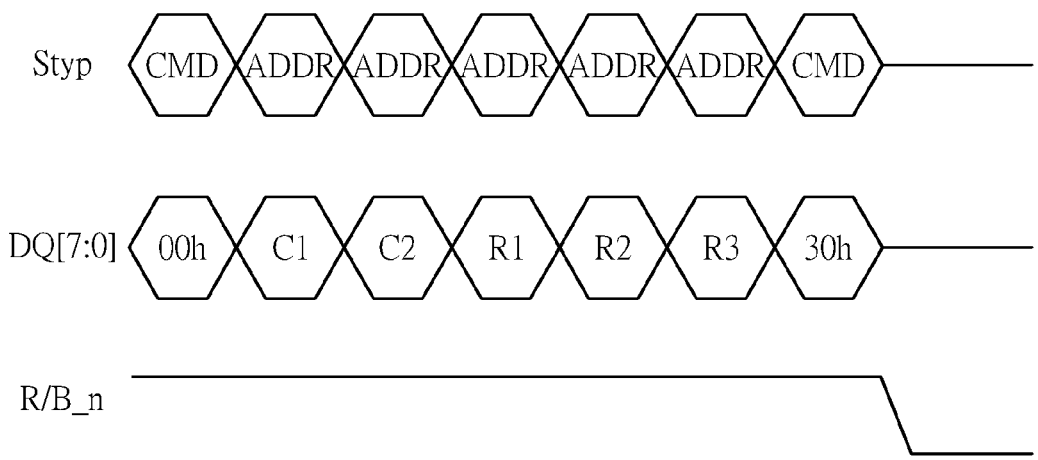
FIG. 4 shows a timing diagram of the normal read operation adopted by the electronic apparatus in FIG. 3.
Figure 5:
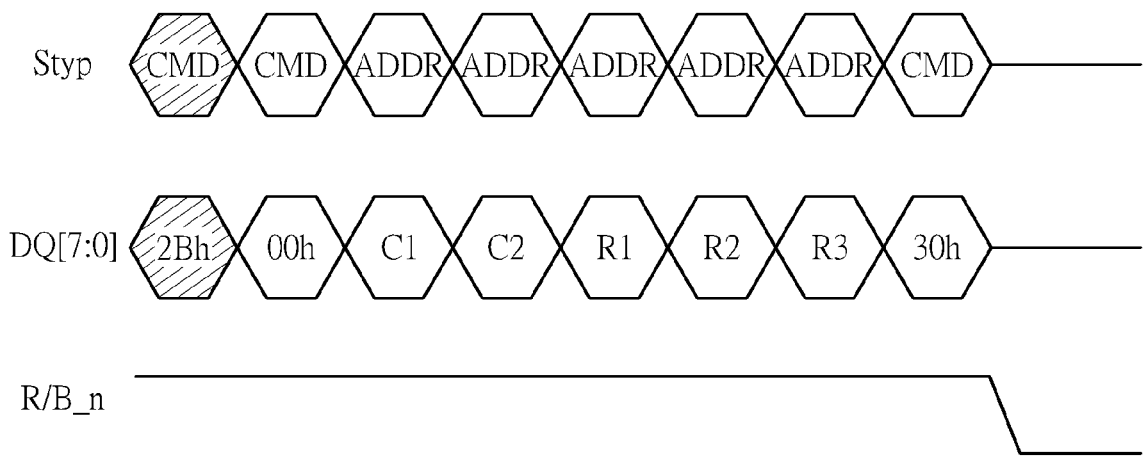
FIG. 5 shows a timing diagram of the recently programmed read operation adopted by the electronic apparatus in FIG. 3.

FIGS. 4 and 5 respectively show timing diagrams of the normal read operation and the recently programmed read operation adopted by the electronic apparatus 3, and each timing diagram includes a data type signal Styp, a data signal DQ[7:0] and a ready/busy signal R/B_n. For the normal read operation, the ready/busy signal R/B_n is set as ready, and a read command following by a sequence of addresses are sent from the microcontroller 302 to the flash memory 34. When receiving the read command and not a recently programmed read command, the flash memory 34 may use the default read level 3402 to fetch data therein. The read command is sent by transmitting a command CMD in the data type signal Styp and data 00h in the data signal DQ[7:0]. The recently programmed read command is sent by transmitting a command CMD in the data type signal Styp and data 2Bh in the data signal DQ[7:0]. The sequence of addresses specifies the location of the data in the flash memory 34. The ready/busy signal R/B_n is set as ready when in a logical high state. For the recently programmed read operation, the ready/busy signal R/B_n is set as ready, and the recently programmed read command following by the read command and a sequence of addresses are sent from the microcontroller 302 to the flash memory 34, when receiving both the recently programmed read command and the read command, the flash memory 34 may use the recently programmed read level 3400 to fetch data therein.

Figure 6:
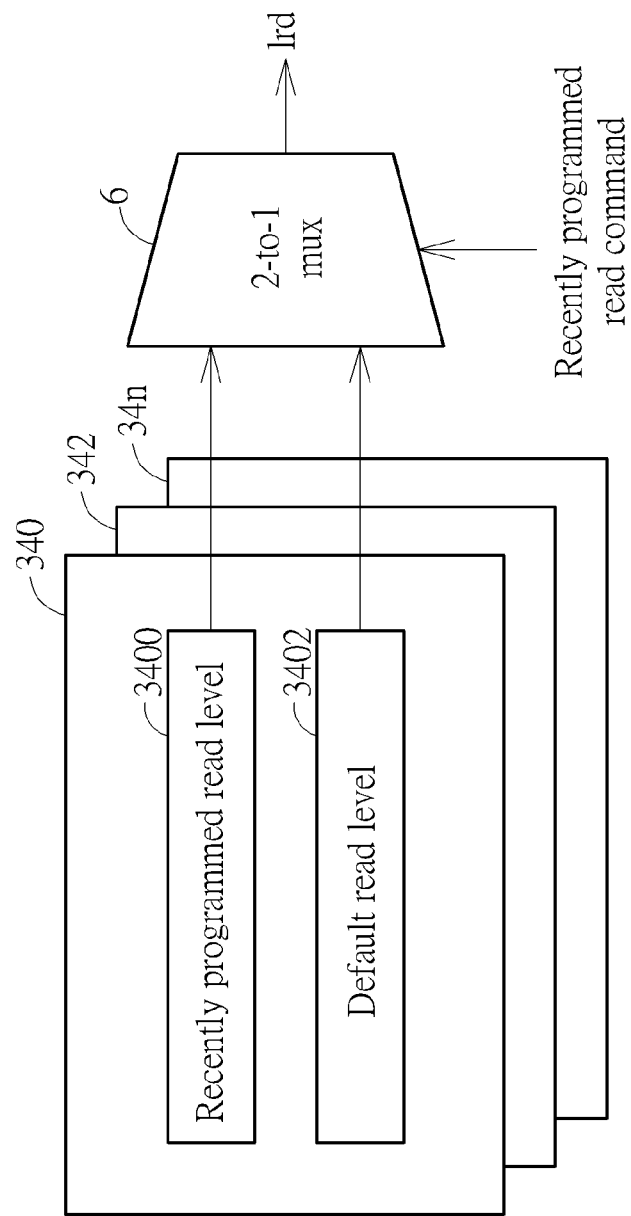
FIG. 6 is a schematic diagram of a multiplexer incorporated in the flash memory in FIG. 3.

FIG. 6 is a schematic diagram of a multiplexer 6 incorporated in the flash memory 34. The multiplexer 6 is coupled to the page 340 of the flash memory 34 to select between the recently programmed read level 3400 and the default read level 3402 according to the recently programmed read command from the microprocessor 302. When the recently programmed read command is received, the multiplexer 6 may select the recently programmed read level 3400 as a read level lrd for reading data from the specified addresses. When the recently programmed read command is not received, the multiplexer 6 may select default read level 3402 as the read level lrd for reading data from the specified addresses.

Figure 7:
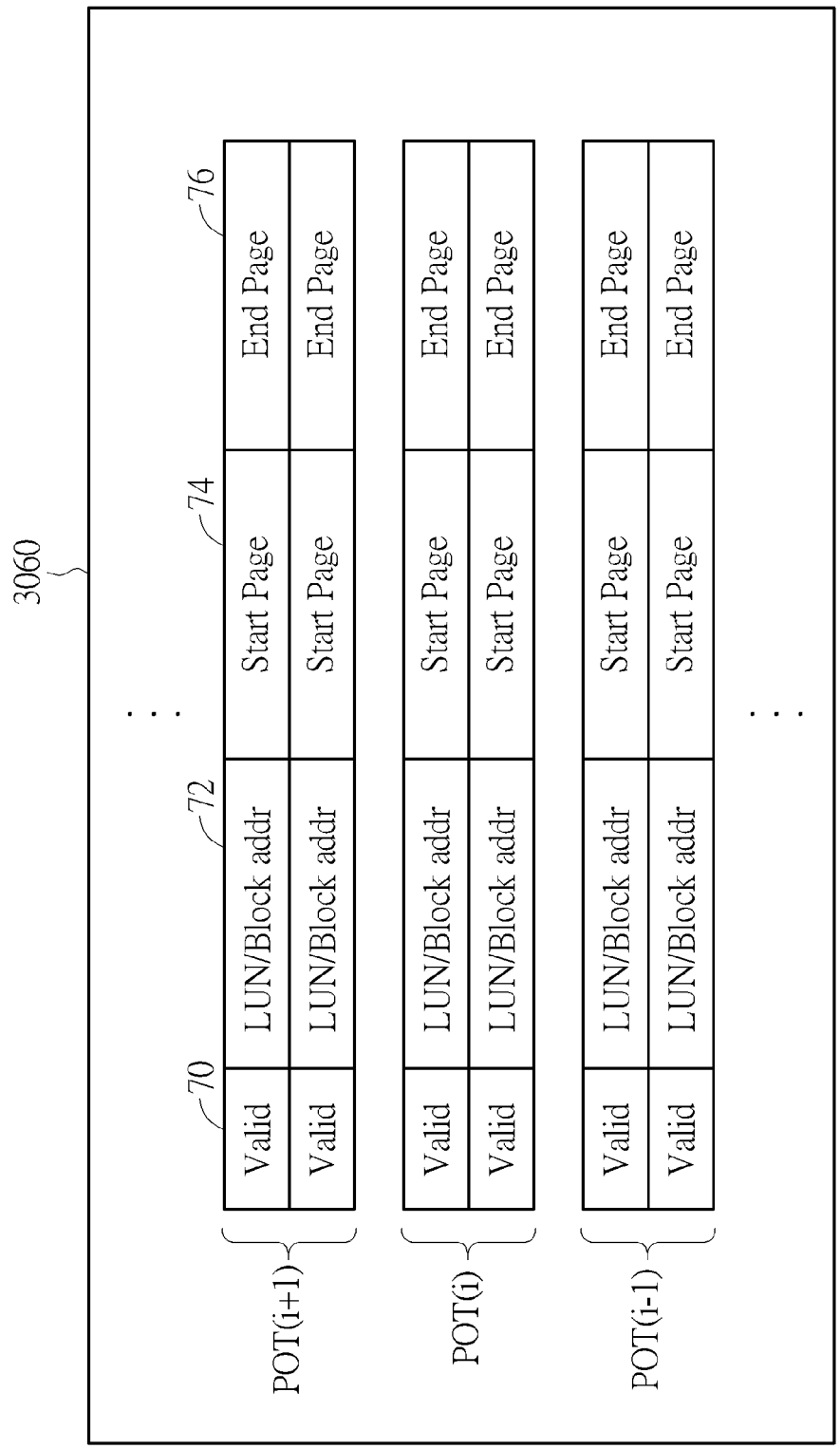
FIG. 7 shows an exemplary data structure of the recently programmed page pool in FIG. 3.

FIG. 7 shows an exemplary data structure of the list of entries 3060 in FIG. 3. In some embodiments, the list of entries 3060 may contain a predetermined number of entries such as 10 entries, and microcontroller 302 may update the list of entries 3060 every second. That is, each entry in the list of entries 3060 has a predetermined lifespan, e.g., 10 seconds. Further, each entry may be indexed by a program order tag (POT) and contain any number of subentries depending on the quantities of data programmed into the flash memory 34 between clock interrupts. FIG. 7 shows 3 entries indexed by POT(i+1), POT(i) and POT(i−1), with the entry POT(i+1) being the newest entry and the entry POT (i−1) being the oldest entry. When no data is programmed between clock interrupts, the microprocessor 304 may update the list of entries 3060 by entering no entry into and removing an expired entry POTxpr at the bottom of the list of entries 3060, and when two pieces of data are programmed between clock interrupts, the microprocessor 304 may update the list of entries 3060 by adding a newest entry POT(i+1) containing two subentries to the top of the list of entries 3060 and removing an expired entry POTxpr at the bottom of the list of entries 3060. The expired entry POTxpr is an entry that has remained in the list of entries 3060 for a predetermined expiration period, such as 10 seconds. Each subentry may comprise a data status 70, a logical unit number (LUN) address and/or block address 72, a start page address 74, and an end page address 76 corresponding to one piece of data in the flash memory 34. The data status indicates data validity of the subentry, and the LUN address and/or the block address 72, the start page address 74 and the end page address 76 are used to address the corresponding piece of data in the flash memory 34.

Figure 8:
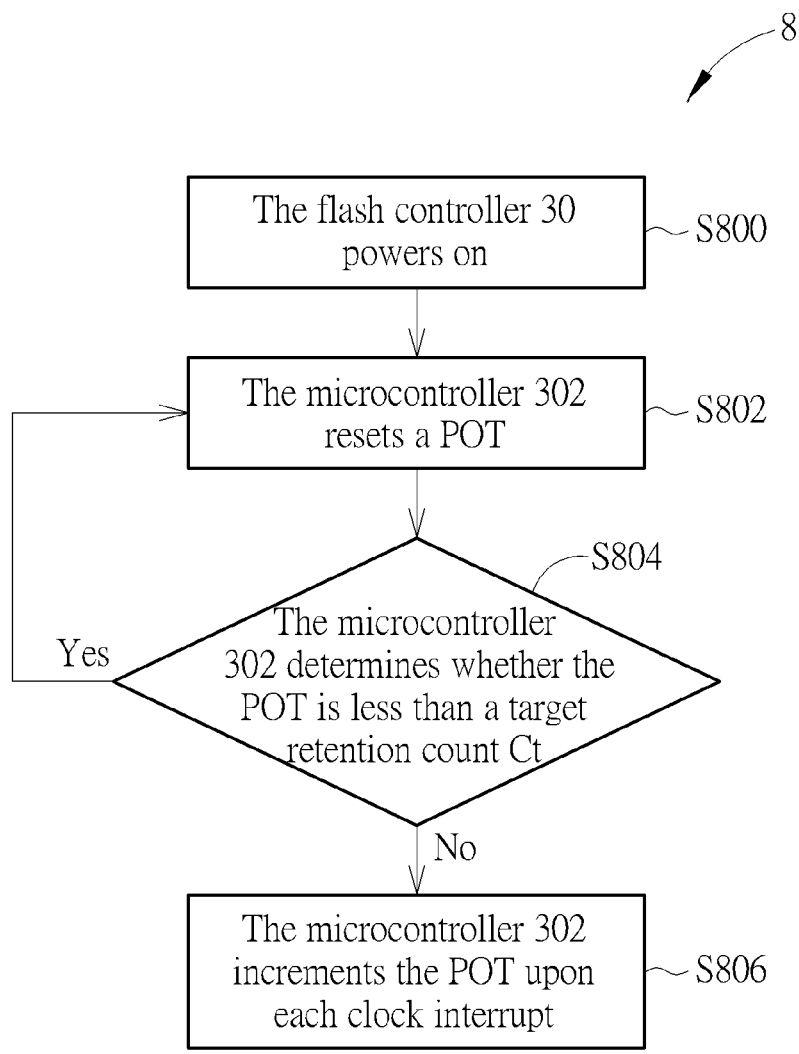
FIG. 8 is a flowchart of a program order tag management process incorporated in the electronic apparatus in FIG. 3.

FIG. 8 is a flowchart of a program order tag (POT) management method 8 adopted by the microcontroller 302. The POT management method 8 is used to generate the list of entries 3060. Any reasonable step change or adjustment is within the scope of the disclosure. The POT management method 8 comprises Steps S800 through S806 as follows:

Step S800: The flash controller 30 powers on;
Step S802: The microcontroller 302 resets a POT;
Step S804: The microcontroller 302 determines whether the POT is less than a target retention count Ct; if so, go to Step S806, and if not, go to Step S802;
Step S806: The microcontroller 302 increments the POT upon each clock interrupt.

Upon power-on of the flash controller 30 (S800), the microcontroller 320 resets the POT to a predefined value, e.g., 0 (S802), and determines whether the POT is less than a target retention count Ct, e.g., 9 (S804). When the POT is less than the target retention count Ct, the microcontroller 302 associates the POT with an entry of data being programmed, and saves the entry into the list of entries 3060 and increments the POT upon each clock interrupt (S806). When the POT is equal to the target retention count, the microcontroller 302 associates the POT with the entry of data being programmed, and saves the entry into the list of entries 3060 and resets the POT upon a clock interrupt (S802).

Figure 9:
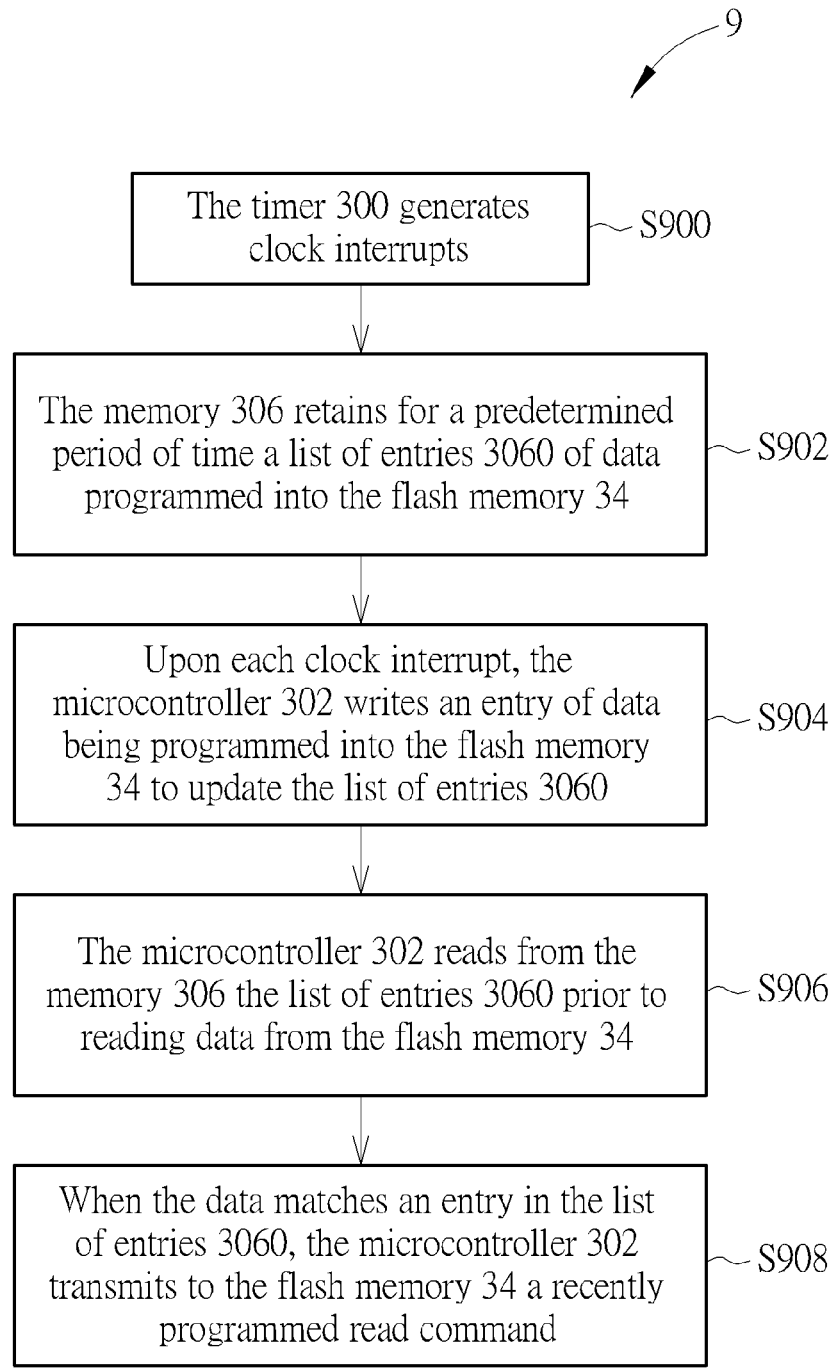
FIG. 9 is a flowchart of a read level management method adopted by the electronic apparatus in FIG. 3.

FIG. 9 is a flowchart of a read level management method 9 adopted by the electronic apparatus 3. The read level management method 9 is used to manage read levels for reading data in the initial retention period and after the initial retention period and comprises Steps S900 through S908, in which Steps S900 through S904 are used to create the list of entries 3060 of the recently programmed data, and Steps S906 and S908 are used to generate a recently programmed read command in order to manage the read levels for reading data from the flash memory 34. Any reasonable step change or adjustment is within the scope of the disclosure. The read level management method 9 is outlined as follows:

Step S900: The timer 300 generates clock interrupts;
Step S902: The memory 306 retains for a predetermined period of time a list of entries 3060 of data programmed into the flash memory 34;
Step S904: Upon each clock interrupt, the microcontroller 302 writes an entry of data being programmed into the flash memory 34 to update the list of entries 3060;
Step S906: The microcontroller 302 reads from the memory 306 the list of entries 3060 prior to reading data from the flash memory 34;
Step S908: When the data matches an entry in the list of entries 3060, the microcontroller 302 transmits to the flash memory 34 a recently programmed read command.

Explanations for Steps S900 through S908 are provided in the preceding paragraphs and will be omitted here for brevity.

As discussed in the preceding paragraphs, the electronic apparatus 3 and the read level management method 9 provide reliable read performance using a simple circuit structure and control mechanism.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A controller, comprising:
  memory configured to store a list of entries of data in Flash memory coupled to the controller, the list of entries comprising location information of data that corresponds to a recently programmed read level different from a default read level; and
  a microcontroller coupled to the memory and configured to:
    periodically update the list of entries based on data programmed into the Flash memory, comprising removing an expired entry from the list of entries, the expired entry comprising an entry that has remained in the list of entries for a predetermined period of time; and
    check the list of entries prior to reading data from the Flash memory to generate a read command, wherein the read command that comprises the location information of data is transmitted to the Flash memory, and the Flash memory is configured to determine a read level for reading the data based on the read command, the read command comprising at least one of a recently programmed read command or a non-recently programmed read command.

2. The controller of claim 1, further comprising a timer coupled to the microcontroller and configured to generate clock interrupts,
wherein the microcontroller is configured to periodically update the list of entries upon receiving each of the clock interrupts.

3. The controller of claim 1, wherein the microcontroller is further configured to in response to the data being read matching an entry in the list of entries, indicate, to the Flash memory, the recently programmed read level for the data being read.

4. The controller of claim 3, wherein the recently programmed read level exceeds the default read level.

5. The controller of claim 3, wherein to indicate the recently programmed read level, the microcontroller is configured to instruct the Flash memory to retrieve the recently programmed read level that is preset and stored in the Flash memory.

6. The controller of claim 5, wherein to instruct the Flash memory, the microcontroller is configured to transmit the recently programmed read command different from the non-recently programmed read command to the Flash memory.

7. The controller of claim 3, wherein to indicate the recently programmed read level, the microcontroller is configured to determine the recently programmed read level on the fly and provide the recently programmed read level to the Flash memory.

8. The controller of claim 1, wherein the memory is configured to store the list of entries for the predetermined period of time.

9. An apparatus, comprising:
Flash memory; and
a controller coupled to the Flash memory and configured to manage data access of the Flash memory, the controller comprising:
  memory configured to store a list of entries of data in the Flash memory, the list of entries pointing to data programmed into the Flash memory and corresponding to a lifespan shorter than a predetermined period of time; and
  a microcontroller coupled to the memory and configured to:
    periodically update the list of entries based on data programmed into the Flash memory;
    check the list of entries prior to reading data from the Flash memory to determine whether data being read from the Flash memory corresponds to a recently programmed read level different from a default read level as a determination result, wherein the recently programmed read level and the default read level are stored in the Flash memory, and the Flash memory is configured to determine a read level, from the recently programmed read level and the default read level, based on the determination result; and
    in response to the data being read matching an entry in the list of entries, determine that the data being read from the Flash memory corresponds to the recently programmed read level and transmit a recently programmed read command different from a non-recently programmed read command to the Flash memory.

10. The apparatus of claim 9, wherein
the controller further comprises a timer coupled to the microcontroller and configured to generate clock interrupts; and
the microcontroller is configured to periodically update the list of entries upon receiving each of the clock interrupts.

11. The apparatus of claim 9, wherein the microcontroller is further configured to in response to the data being read matching an entry in the list of entries, indicate, to the Flash memory, the recently programmed read level for the data being read.

12. The apparatus of claim 11, wherein the recently programmed read level exceeds the default read level.

13. The apparatus of claim 11, wherein to indicate the recently programmed read level, the microcontroller is configured to instruct the Flash memory to retrieve the recently programmed read level that is preset and stored in the Flash memory.

14. The apparatus of claim 11, wherein to indicate the recently programmed read level, the microcontroller is configured to determine the recently programmed read level on the fly and provide the recently programmed read level to the Flash memory.

15. The apparatus of claim 9, wherein the memory is configured to store the list of entries for the predetermined period of time.

16. A method for managing read levels of Flash memory, comprising:
storing a list of entries of data in the Flash memory, the list of entries comprising location information of data that corresponds to a recently programmed read level different from a default read level;
periodically updating the list of entries based on data programmed into the Flash memory, comprising removing an expired entry from the list of entries, the expired entry comprising an entry that has remained in the list of entries for a predetermined period of time; and
checking the list of entries prior to reading data from the Flash memory to generate a read command, wherein the read command that comprises the location information of data is transmitted to the Flash memory, and the Flash memory is configured to determine a read level for reading the data based on the read command, the read command comprising at least one of a recently programmed read command or a non-recently programmed read command.

17. The method of claim 16, further comprising generating clock interrupts, wherein periodically updating comprises periodically updating the list of entries upon receiving each of the clock interrupts.

18. The method of claim 16, further comprising in response to the data being read matching an entry in the list of entries, indicating, to the Flash memory, the recently programmed read level for the data being read.

19. The method of claim 18, wherein the recently programmed read level exceeds the default read level.

20. The apparatus of claim 9, wherein:
the microcontroller is configured to generate a read command and transmit the read command to the Flash memory, the read command comprising location information of the data being read; and
the Flash memory is configured to determine a read level for reading the data based on the read command, the read command comprising at least one of the recently programmed read command or the non-recently programmed read command.

\* \* \* \* \*